(12) United States Patent
Wu et al.

(10) Patent No.: US 8,961,196 B2
(45) Date of Patent: Feb. 24, 2015

(54) ELECTRICAL CONNECTOR AND A PRINTED CIRCUIT BOARD FORMED IN SAID ELECTRICAL CONNECTOR

(71) Applicant: Hon Hai Precision Industry Co., Ltd., New Taipei (TW)

(72) Inventors: Jerry Wu, Irvine, CA (US); Chien-Chiung Wang, New Taipei (TW); Jun Chen, Kunshan (CN); Fan-Bo Meng, Kunshan (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 16 days.

(21) Appl. No.: 13/919,794

(22) Filed: Jun. 17, 2013

(65) Prior Publication Data

US 2013/0337689 A1    Dec. 19, 2013

(30) Foreign Application Priority Data

Jun. 16, 2012    (CN) .......................... 2012 1 0198300

(51) Int. Cl.
  *H01R 12/00*     (2006.01)
  *H01R 13/66*     (2006.01)
  *H05K 1/02*      (2006.01)
  *H05K 1/11*      (2006.01)

(52) U.S. Cl.
  CPC .......... *H01R 13/6658* (2013.01); *H05K 1/0259* (2013.01); *H05K 1/117* (2013.01); *H05K 2201/09154* (2013.01); *H05K 2201/09481* (2013.01); *H05K 2201/09618* (2013.01)

USPC ........................................... 439/76.1

(58) Field of Classification Search
  USPC .............. 439/76.1, 108, 101, 924.1, 181, 951
  See application file for complete search history.

(56) References Cited

U.S. PATENT DOCUMENTS

| | | | |
|---|---|---|---|
| 4,532,419 A * | 7/1985 | Takeda .......................... | 235/492 |
| 7,114,980 B1 | 10/2006 | Wu | |
| 7,803,010 B1 * | 9/2010 | Hwang .......................... | 439/497 |
| 8,007,294 B2 * | 8/2011 | Tanaka .......................... | 439/108 |
| 8,292,655 B1 * | 10/2012 | Ling et al. ..................... | 439/497 |
| 2011/0256776 A1 | 10/2011 | Reed | |

FOREIGN PATENT DOCUMENTS

CN           2909584        6/2007

* cited by examiner

*Primary Examiner* — Phuong Dinh
(74) *Attorney, Agent, or Firm* — Wei Te Chung; Ming Chieh Chang

(57) ABSTRACT

An electrical connector comprises a metallic housing; and a printed circuit board receiving in the metallic housing and defining a mating portion formed on a front end thereof. The mating portion defines a plurality of conductive pads formed on a top surface thereof, the plurality of conductive pads comprises a plurality of first grounding contacts, a plurality of pairs of differential signal contacts and a plurality of second grounding contacts, each of pair of differential signal contacts are intervened between two adjacent grounding contacts, each of second grounding contact is located in front of the pair of differential signal contacts and electrically and mechanically connected with two front ends of two first grounding contacts.

4 Claims, 4 Drawing Sheets

US 8,961,196 B2

ELECTRICAL CONNECTOR AND A PRINTED CIRCUIT BOARD FORMED IN SAID ELECTRICAL CONNECTOR

FIELD OF THE INVENTION

The present invention generally relates to an electrical connector and a printed circuit board formed in said electrical connector, more specifically to an electrical connector with high signal transmitting rate.

DESCRIPTION OF PRIOR ART

U.S. Pat. No. 7,114,980 issued to Wu on Oct. 3, 2006 discloses an electrical connector comprising a metallic housing, a printed circuit board received into the housing. The printed circuit board defines a plurality of conductive pads respectively formed on top and bottom surfaces of a front and rear ends thereof. The plurality of conductive pads comprises a plurality of grounding contacts and a plurality of pairs of differential signal contacts. Two adjacent pairs of differential signal contacts are spaced apart by a grounding contact.

U.S. Published. No. 20110256776 published to Reed on Oct. 20, 2011 also discloses an electrical connector with a printed circuit board formed therein. Please refer to FIG. 13A of U.S. Published. No. 20110256776, the printed circuit board defines several pairs of differential signal contacts and a plurality of grounding contact intervened between two adjacent differential signal contacts. The printed circuit board further defines two short conductive pads respectively located in front of each of the pair of differential signal contacts for preventing electrostatic discharge (ESD). Arrangement of the plurality of grounding contacts and conductive pads of the printed circuit board of the electrical connector will influence electrostatic discharge performance of the electrical connector. Actually, in the above said prior art, the arrangement of the conductive pads are not optimization. Thus, electrostatic discharge (ESD) performance is not good enough.

An electrical connector with an improved printed circuit board overcoming shortages of existing technology is needed.

SUMMARY OF THE INVENTION

Accordingly, an object of the present invention is to provide an electrical connector with improved printed circuit board for preventing electrostatic discharge (ESD).

In order to achieve the above-mentioned object, an electrical connector comprises: a metallic housing; and a printed circuit board receiving in the metallic housing and defining a mating portion formed on a front end thereof. The mating portion defines a plurality of conductive pads formed on a top surface thereof, the plurality of conductive pads comprises a plurality of first grounding contacts, a plurality of pairs of differential signal contacts and a plurality of second grounding contacts, each of pair of differential signal contacts are intervened between two adjacent grounding contacts, each of second grounding contact is located in front of the pair of differential signal contacts and electrically and mechanically connected with two front ends of two first grounding contacts.

Other objects, features and advantages of the invention will be apparent from the following detailed description taken in connection with the accompanying drawings.

DETAILED DESCRIPTION OF PREFERRED EMBODIMENTS

Figure 1:
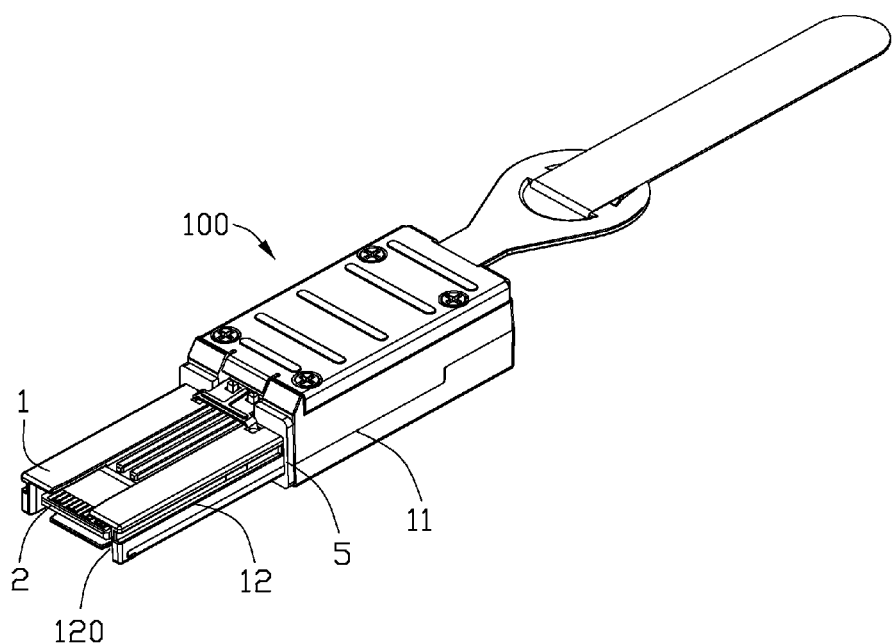
FIG. 1 is a perspective view of an electrical connector in accordance with the present invention.

Reference will now be made to the drawing figures to describe the present invention in detail.

Figure 2:
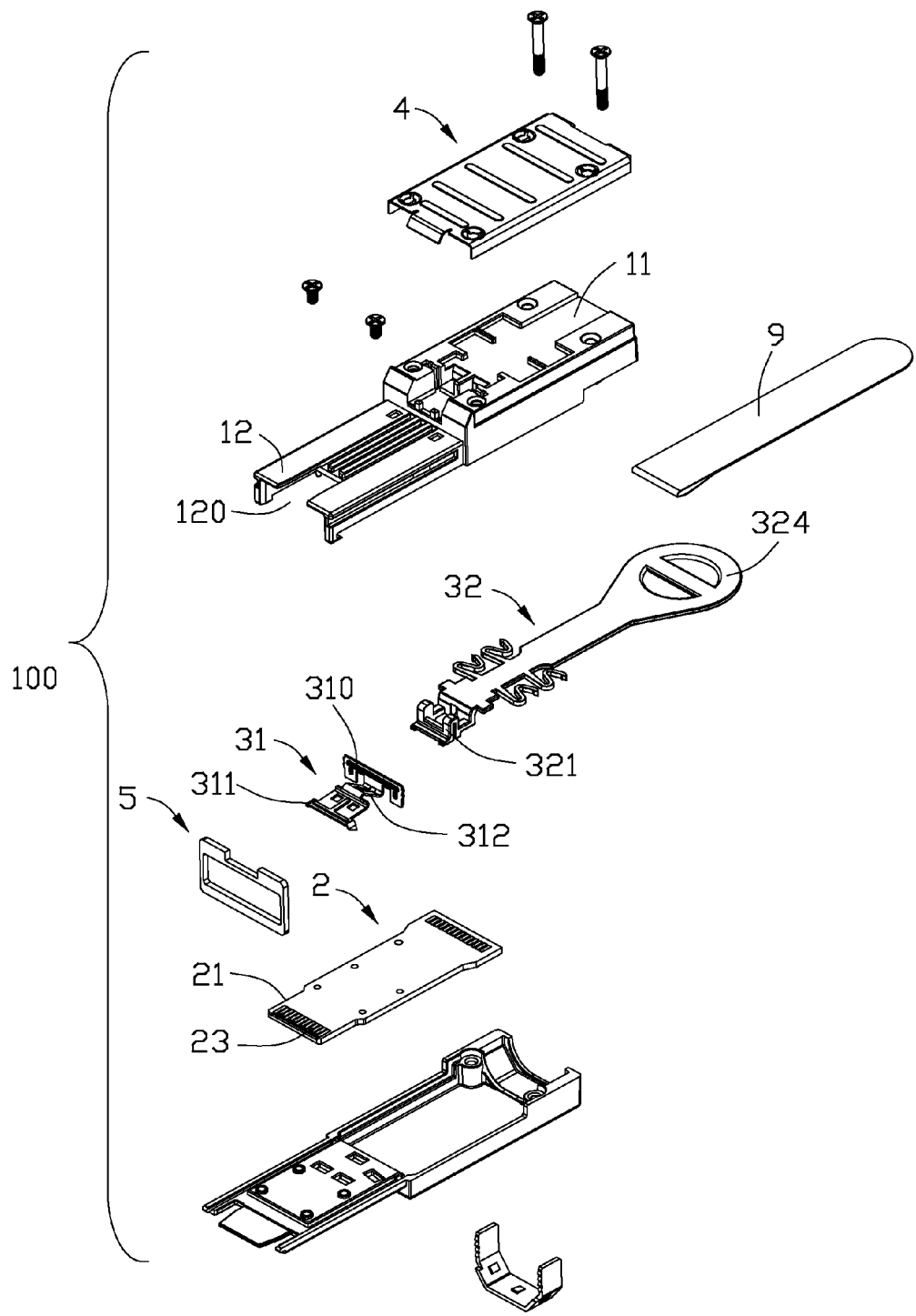
FIG. 2 is an exploded, perspective view of FIG. 1.
Figure 3:
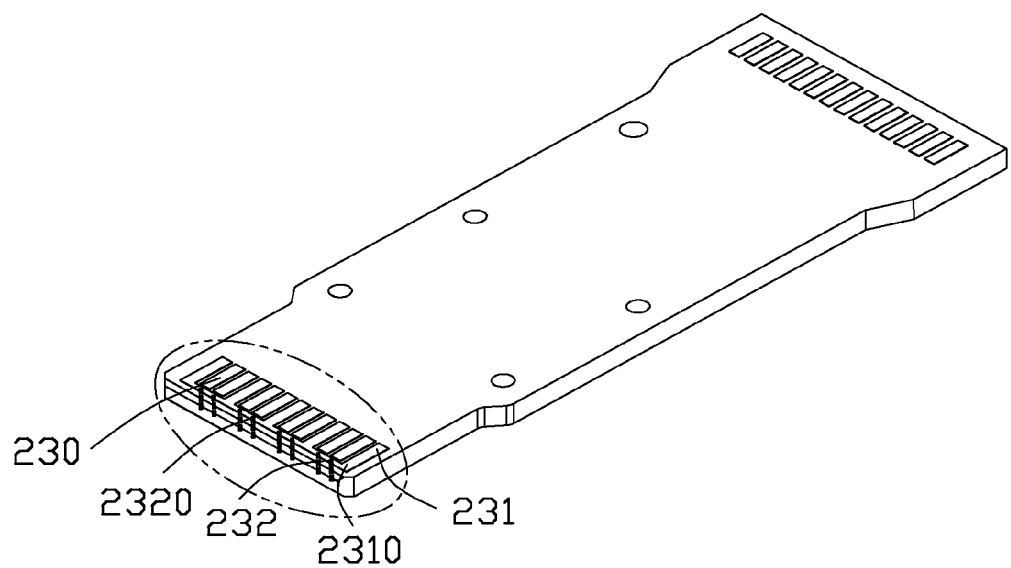
FIG. 3 is an enlarge perspective view of the printed circuit board shown in FIG. 2.
Figure 4:
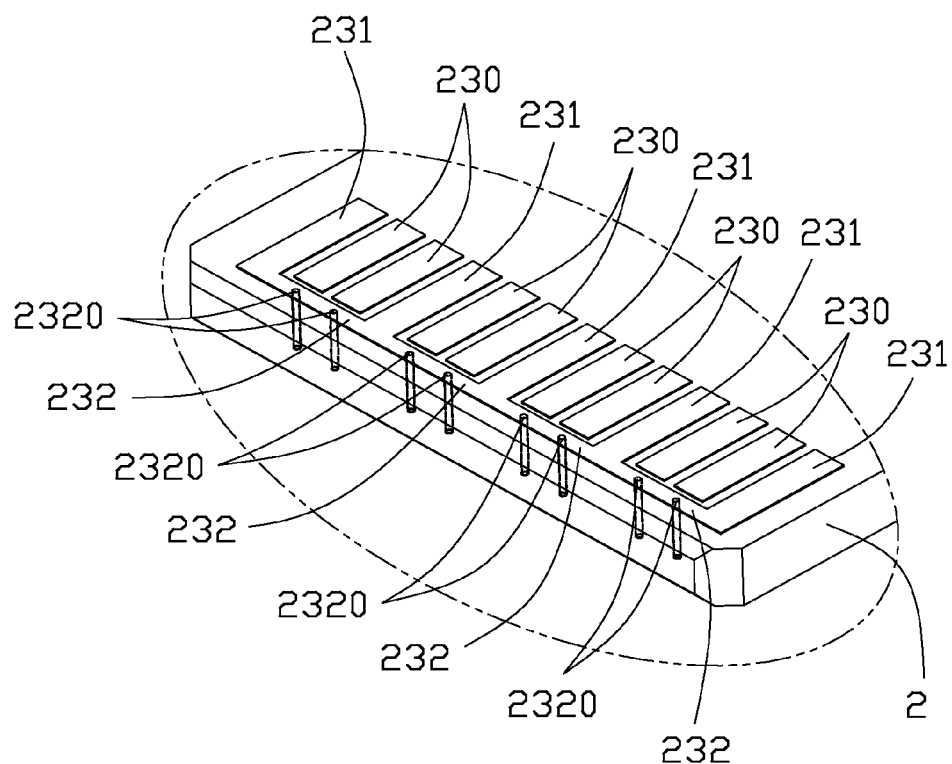
FIG. 4 is an enlarge perspective view of an oval-shaped circle shown in FIG. 3.

FIG. 1 illustrate perspective view of an electrical connector 100 made in accordance with the present invention. Referring to FIG. 2, the electrical connector 100 comprises a metallic housing 1, a printed circuit board 2 received into the housing 1, a latch mechanism 3 assembled to an exterior surface of the housing 1, a metallic shell 4 shielding a portion of the latch mechanism 3 and a gasket 5 surrounding the metallic housing 1.

Referring to FIGS. 1 to 2, the metallic housing 1 defines a body portion 11 and a mating portion 12 extending forwardly from the body portion 11. The metallic housing 1 defines a receiving room 120 formed therein.

Referring to FIGS. 1 to 4, the printed circuit board 2 is received into the receiving room 120 of the housing 1 and extending along a longitudinal direction. The printed circuit board 2 defines a front mating portion 21 with a plurality of conductive pads 23 formed on opposite top and bottom surfaces thereof. The plurality of conductive pads 23 comprises a plurality of first grounding contacts 231 extending along a longitudinal direction, a plurality of pairs of differential signal contacts 230 extending along a longitudinal direction and a plurality of second grounding contacts 232 extending along a transversal direction. Each pair of differential signal contacts 230 are intervened between two adjacent first grounding contacts 231. Each of the second grounding contact 231 is located in front of a pair of differential signal contacts 230 and is electrically and mechanically connected with two front ends 2310 of two first grounding contacts 231 located at two sides of the pair of differential signal contacts 230. The front end 2310 of each first grounding contact 231 is located in front of a front end (not labeled) of each signal contact 230. In other word, the front end 2310 of the first grounding contact 231 is located more closer to a front edge of of the printed circuit board 2 than the front end of the signal contacts 230 to the front edge of the printed circuit board 2. The printed circuit board 2 further defines a plurality of through holes 2320 extending along a vertical direction throughout top and bottom surfaces thererof. Each of two through holes 2320 extends from top surface of the second grounding contact 232 to bottom surface of the printed circuit board 2. Due to the through holes 2320 existed on the second grouding contacts 232, the second grounding contacts 232 will not easily to be peeled when the electrical connector 100 is mated with the complemenatry connector (not shown). In addition, the first and second grounding contacts 231 are electrically connected to inner grounding layer (not shown) of the printed circuit board 2.

Referring to FIG. 2, the latch mechanism 3 comprises a latching member 31 and a pulling member 32 connected with each other and assembled to the base portion 11 of the housing 1 together. The pulling member 32 is discrete from the latching member 31 and capable of moving along a front to rear direction relative to the housing 1. The latch mechanism 3 further comprises a tape 9 connected to the pulling member 32. The pulling member 324 comprises a rear operating portion 324 and a front actuating portion 321 attached to the latching member 31. The latching member 31 comprises an engaging portion 310 engaged to the base portion 11, an inclined middle portion 312 cooperated with the actuating portion 321 and a latching portion 311 located above the mating portion 12.

In the present invention, the first and second grounding contacts 231, 232 are electrically connected with each other and arranged in a common grounding line. When the electrical connector 100 is mated with the complementary connector, grounding contact therebetween will be occurred firstly. Thus, static electricity will be leaded into earth in a shortest time. As a result, electrostatic discharge (ESD) will be effective prevented when the electrical connector is mated with the complementary connector.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. An electrical connector comprising:
  a metallic housing; and
  a printed circuit board receiving in the metallic housing and defining a mating portion formed on a front end thereof;
  wherein the mating portion defines a plurality of conductive pads formed on a top surface thereof, the plurality of conductive pads comprises a plurality of first grounding contacts, a plurality of pairs of differential signal contacts and a plurality of second grounding contacts, each of pair of differential signal contacts are intervened between two adjacent grounding contacts, each of second grounding contact is located in front of the pair of differential signal contacts and electrically and mechanically connected with two front ends of two first grounding contacts, wherein the printed circuit board defines a plurality of through holes extending along a vertical direction and throughout top and bottom surfaces thereof, wherein each of two through holes extend downwardly from top surface of each of second grounding contact, wherein the metallic housing defines a body portion and a mating portion extending forwardly from the body portion, wherein the metallic housing defines a receiving room formed therein for receiving the printed circuit board.

2. The electrical connector as recited in claim 1, wherein the electrical connector further comprise a latch mechanism assembled to an exterior surface of the metallic housing.

3. The electrical connector as recited in claim 2, wherein the latch mechanism a latching member and a pulling member attached with each other.

4. A printed circuit board formed in an electrical connector for mating with a complementary connector comprising:
  a plurality of pairs of differential signal contacts and a plurality of first grounding contacts arranged along a transversal direction and spaced apart with each other, each of pair of differential signal contacts intervened between two adjacent first grounding contacts, and
  a plurality of second grounding contacts respectively located in front of the plurality of differential signal contacts, and electrically and mechanically connected with two front ends of the two second grounding contacts, wherein the plurality of pairs of differential signal contacts and the first grounding contacts are extending along a longitudinal direction, the second grounding contacts are extending along a transversal direction, wherein the plurality of second contacts are respectively perpendicular to the plurality of first contacts, wherein two through holes are formed on each of the second grounding contact and extending downwardly to a bottom surface of the printed circuit board.

* * * * *